United States Patent
Luo et al.

(10) Patent No.: US 12,500,540 B2
(45) Date of Patent: Dec. 16, 2025

(54) SYSTEM FOR MUTUAL INDUCTANCE CANCELLATION FOR H-TYPE MULTILEVEL CONVERTERS

(71) Applicant: GM GLOBAL TECHNOLOGY OPERATIONS LLC, Detroit, MI (US)

(72) Inventors: Yilun Luo, Ann Arbor, MI (US); Junghoon Kim, Springboro, OH (US); Khorshed Mohammed Alam, Canton, MI (US); Chandra S. Namuduri, Troy, MI (US); Rashmi Prasad, Troy, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 161 days.

(21) Appl. No.: 18/501,261

(22) Filed: Nov. 3, 2023

(65) Prior Publication Data
US 2025/0150012 A1    May 8, 2025

(51) Int. Cl.
| | |
|---|---|
| H02M 1/12 | (2006.01) |
| B60L 15/00 | (2006.01) |
| H02P 27/06 | (2006.01) |
| H05K 7/20 | (2006.01) |

(52) U.S. Cl.
CPC ............ *H02P 27/06* (2013.01); *B60L 15/007* (2013.01); *H05K 7/209* (2013.01); *B60L 2210/40* (2013.01)

(58) Field of Classification Search
CPC ........ H02P 27/06; B60L 15/007; H05K 7/209
See application file for complete search history.

(56) References Cited

U.S. PATENT DOCUMENTS

| | | | |
|---|---|---|---|
| 12,172,548 B2 | 12/2024 | Ling et al. | |
| 2006/0152085 A1* | 7/2006 | Flett | H02M 7/003 307/75 |
| 2006/0274561 A1* | 12/2006 | Ahmed | H02M 7/003 361/699 |

(Continued)

FOREIGN PATENT DOCUMENTS

| | | |
|---|---|---|
| DE | 19724356 C1 | 5/1998 |
| DE | 102021114080 A1 | 5/2022 |
| DE | 102021203869 A1 | 10/2022 |

OTHER PUBLICATIONS

Neutral-Point-Less (NPL) Multilevel Inverter Topology With Single DC-Link Capacitor: H- Type Inverter; Mikayla Benson, Xiaofang Dong, Musab Guven, and Kangbeen Lee; Conference Paper, Jun. 2022; DOI: 10.1109/ITEC53557.2022.9813762; Department of Electrical and Computer Engineering; East Lansing, Michigan, 7 pages.

(Continued)

*Primary Examiner* — Muhammad S Islam
(74) *Attorney, Agent, or Firm* — Quinn IP Law

(57) ABSTRACT

A multi-phase power inverter for an electric propulsion system includes a plurality of H-type multilevel power converters arranged between a high-voltage DC power supply and an electric machine. Each of the plurality of H-type multilevel power converters is a solid-state integrated circuit (IC) that includes a positive DC power bus, a negative DC power bus, a neutral bus, and a plurality of semiconductor switches disposed in a stacked arrangement. The plurality of semiconductor switches is interconnected via the positive DC power bus, the negative DC power bus, and the neutral bus.

8 Claims, 6 Drawing Sheets

(56) References Cited

U.S. PATENT DOCUMENTS

| | | |
|---|---|---|
| 2016/0043659 A1 | 2/2016 | Xu et al. |
| 2016/0141962 A1 | 5/2016 | Outram et al. |
| 2017/0353137 A1 | 12/2017 | Pan et al. |
| 2018/0097452 A1 | 4/2018 | Chapman et al. |
| 2018/0248493 A1 | 8/2018 | Mihalache |
| 2018/0288907 A1* | 10/2018 | Richards ............... H01L 23/473 |
| 2019/0061537 A1 | 2/2019 | Ge et al. |
| 2019/0348924 A1 | 11/2019 | Kumar et al. |
| 2020/0053900 A1* | 2/2020 | Feurtado ............... H02M 7/537 |
| 2021/0234475 A1 | 7/2021 | Banerjee et al. |
| 2021/0297009 A1 | 9/2021 | Liu et al. |
| 2022/0304185 A1* | 9/2022 | Nishimachi ......... H02M 7/5387 |
| 2023/0238895 A1* | 7/2023 | Moon .................. H02M 7/487 |
| | | 363/40 |

OTHER PUBLICATIONS

Comprehensive Electromagnetic Interference Analysis of Neutral-Point-Less (NPL) Multilevel Inverter With Active Common-Mode Voltage Cancellation; Kangbeen Lee, Mikayla Benson, Mostafa Fereydoonian, and Xiaofeng Dong; Conference Paper, Mar. 2023; DOI: 10.1109/APEC43580.2023.10131636.

* cited by examiner

SYSTEM FOR MUTUAL INDUCTANCE CANCELLATION FOR H-TYPE MULTILEVEL CONVERTERS

The concepts described herein relate generally to vehicles employing electrified powertrain or propulsion systems, which are composed with direct current (DC) power supplies providing electric power to multi-phase power inverters to control operation of one or multiple electric machines.

High-voltage and high-power multilevel inverters (MLIs) have gained attention as the transportation electrification trend is rapidly expanding towards high-capacity mass transit systems such as electric aircraft, trains, and ships. MLIs such as neutral point clamped (NPC) and T-type inverters provide high-voltage and high-power operation capabilities but require stacked DC-link capacitors with a neutral point connection for zero voltage vector. This neutral point connection to the stacked DC-link capacitor may generate a neutral current oscillating at three times the fundamental frequency, which may cause capacitor voltage imbalance and/or overvoltage stress on capacitors and switching devices.

A multi-phase inverter circuit may generate an inherent power loop in which high current flows from a DC-link capacitor to a high-side of the multilevel power inverter, then to a low-side of the multilevel power inverter and back. The power loop may generate a magnetic field, which forms parasitic inductance.

As multi-phase power inverters operate at higher switching frequencies, even small levels of parasitic inductance may lead to issues, for example, but not limited to, ringing and/or electromagnetic interference (EMI).

The current flow path determines the size of the power loop, which determines the size of the magnetic field generated, and hence the size of the parasitic inductance, and the current flow path is defined by the topology of the circuit, the topology of the circuit may affect the size of the parasitic inductance.

SUMMARY

In view of the above discussion, it is useful to develop a system and method of mutual inductance cancellation for a multi-phase power inverter including a plurality of H-type multilevel power converters having a topology that reduces parasitic inductance within the multi-phase power inverter.

The concepts disclosed herein relate to a system for a multi-phase power inverter including a plurality of H-type multilevel power converters that achieve mutual inductance cancellation. Such a system may be used in a vehicle having an electrified propulsion system, for example, but not limited to, a motor vehicle having an electrified powertrain or propulsion system, e.g., an electric vehicle (EV) or plug-in hybrid vehicle (PHEV), or another mobile platform, which may be powered by an electric propulsion system, to reduce parasitic inductance within the multi-phase power inverter.

Each multi-phase power inverter may include a plurality of H-type multilevel power converters arranged between a high-voltage direct current (DC) power supply and an electric machine. The number of H-type multilevel power converters required is application specific.

Each H-type multilevel power converter is a solid-state integrated circuit (IC) that includes a plurality of circuit components, for example, but not limited to, semiconductor switches, buses, and busbars, which are connected to form a network of interconnections through which current may flow. The form of this network of interconnected circuitry is called a circuit topology.

The concepts described herein provide a multi-phase power inverter that is advantageously arranged to minimize stray inductance and loop inductance employing magnetic field cancellation. This includes using cancelling fields by arranging positive, neutral, and negative buses and a plurality of H-type multilevel power converters in solid-state integrated circuits with stacked or tiered elements. The arrangement of each H-type multilevel power converter with stacked or tiered elements enables either single-sided or double-sided cooling to reduce thermal impedance. Resultants of reduced stray inductance may include lower switching loss, less ringing, less electromagnetic interference (EMI), and lower device thermal stress.

An aspect of the disclosure may include a multi-phase power inverter for an electric drivetrain, wherein the multi-phase power inverter transforms high-voltage DC electric power to multi-phase AC power that is transferred to the electric drivetrain. The multi-phase power inverter includes a plurality of H-type multilevel power converters that are arranged between a high-voltage DC power supply and an electric machine.

Each of the plurality of H-type multilevel power converters is a solid-state integrated circuit (IC) having a plurality of semiconductor switches, a positive DC power bus, a negative DC power bus, and a neutral bus, which are disposed in a stacked arrangement or a tiered configuration between a first direct bonded copper (DBC) plate and a second DBC plate. The solid-state also includes a first AC bus, a second AC bus, a first heat sink, and a second heat sink. The plurality of semiconductor switches is interconnected via the positive DC power bus, the negative DC power bus, and the neutral bus. The plurality of semiconductor switches includes a first semiconductor switch, a second semiconductor switch, a third semiconductor switch, a fourth semiconductor switch, a fifth semiconductor switch, and a sixth semiconductor switch.

The first semiconductor switch is arranged in series with the second semiconductor switch between the positive DC power bus and the negative DC power bus, with the first semiconductor switch being connected to the second semiconductor switch at a first node. The third semiconductor switch is arranged in series with the fourth semiconductor switch between the positive bus and the negative bus, with the third semiconductor switch being connected to the fourth semiconductor switch at a second node. The fifth semiconductor switch is arranged in series with the sixth semiconductor switch via the neutral bus, with the fifth semiconductor switch being connected to the first node and the sixth semiconductor switch being connected to the second node. The first node is connected to the first AC bus, and the second node is connected to the second AC bus.

The first heat sink is adjoined to the solid-state IC via the first DBC substrate; and the second heat sink is adjoined to the solid-state IC via the second DBC substrate.

Another aspect of the disclosure may include the stacked arrangement including a stack having: a first tier composed of the first semiconductor switch arranged to be coplanar with the second semiconductor switch; a second tier composed of the fifth semiconductor switch arranged to be coplanar with the sixth semiconductor switch, wherein the first tier is arranged in parallel with the second tier; and a third tier composed of the third semiconductor switch arranged to be coplanar with the fourth semiconductor switch, wherein the second tier is arranged in parallel with the third tier.

Another aspect of the disclosure may include the positive DC power bus and the negative DC power bus being arranged on a first end of the H-type multilevel power converter, and wherein the first AC bus and the second AC bus are arranged on a second end of the H-type multilevel power converter.

Another aspect of the disclosure may include the second AC bus projecting outwardly from a bottom portion of the solid-state IC.

Another aspect of the disclosure may include the stacked arrangement having a stack having: a first tier composed of the first semiconductor switch, the second semiconductor switch, the third semiconductor switch, and the fourth semiconductor switch arranged to be coplanar with one another; and a second tier composed of the fifth semiconductor switch arranged to be coplanar with the sixth semiconductor switch, wherein the first tier is arranged in parallel with the second tier.

Another aspect of the disclosure may include the positive DC power bus and the negative DC power bus being arranged on a first end of the H-type multilevel power converter, and wherein the first AC bus and the second AC bus are arranged on a second end of the H-type multilevel power converter.

Another aspect of the disclosure may include the stacked arrangement including a stack having: a first tier composed of the second semiconductor switch arranged to be coplanar with the fourth semiconductor switch; a second tier composed of the fifth semiconductor switch arranged to be coplanar with the sixth semiconductor switch; and a third tier composed of the first semiconductor switch arranged to be coplanar with the third semiconductor switch, wherein the first tier is arranged in parallel with the second tier.

Another aspect of the disclosure may include the positive DC power bus and the negative DC power bus being arranged on a first end of the H-type multilevel power converter, and wherein the first AC bus and the second AC bus are arranged on a second end of the H-type multilevel power converter.

Another aspect of the disclosure may include the stacked arrangement including a stack having: a first tier composed of the first semiconductor switch arranged to be coplanar with the second semiconductor switch; a second tier composed of the fifth semiconductor switch arranged to be coplanar with the sixth semiconductor switch; and a third tier composed of the third semiconductor switch arranged to be coplanar with the fourth semiconductor switch, wherein the first tier is arranged in parallel with the second tier.

Another aspect of the disclosure may include the first semiconductor switch, the second semiconductor switch, the third semiconductor switch, and the fourth semiconductor switch, each being a gallium nitride (GaN) device.

Another aspect of the disclosure may include the fifth semiconductor switch and the sixth semiconductor switch, each being an insulated-gate bipolar transistor (IGBT).

Another aspect of the disclosure may include a method of inductance cancellation in a multi-phase power inverter, including: arranging a plurality of semiconductor switches in an H-type multilevel stack; assembling the plurality of semiconductor switches, arranged into the H-type multilevel stack, into a solid-state integrated circuit (IC) having: a positive DC power bus; a negative DC power bus; and a neutral bus; and interconnecting the plurality of semiconductor switches via the positive DC power bus, the negative DC power bus, and the neutral bus.

Another aspect of the disclosure may include a vehicle including an electric propulsion system, wherein the vehicle includes an electric propulsion system, the electric propulsion system including: an electric motor configured to provide power to the electric propulsion system; a multi-phase power inverter including a plurality of H-type multilevel power converters arranged between a high-voltage direct current (DC) power supply and the electric motor, wherein each of the plurality of H-type multilevel power converters is a solid-state integrated circuit (IC) including: a positive DC power bus; a negative DC power bus; a neutral bus; a plurality of semiconductor switches disposed in a stacked arrangement, wherein the plurality of semiconductor switches are interconnected via the positive DC power bus, the negative DC power bus, and the neutral bus.

The above features and advantages, and other features and attendant advantages of this disclosure, will be readily apparent from the following detailed description of illustrative examples and modes for carrying out the present disclosure when taken in connection with the accompanying drawings and the appended claims. Moreover, this disclosure expressly includes combinations and sub-combinations of the elements and features presented above and below.

BRIEF DESCRIPTION OF THE DRAWINGS

The accompanying drawings, which are incorporated into and constitute a part of this specification, illustrate implementations of the disclosure which, taken together with the description, serve to explain the principles of the disclosure.

Figure 1:
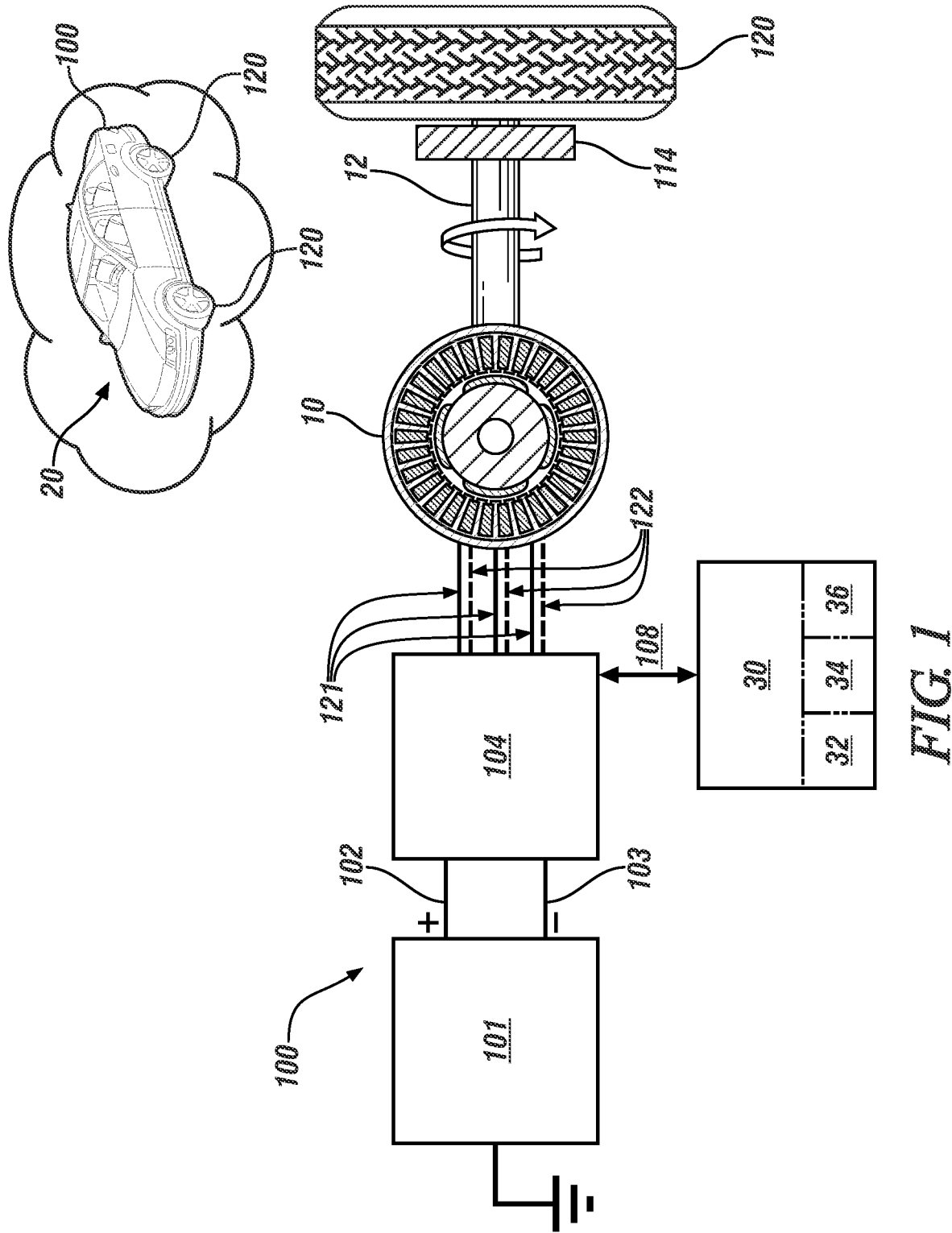
FIG. 1 schematically illustrates an electric drivetrain system including a multi-phase power inverter that is arranged between a high-voltage DC power supply and an electric machine, in accordance with the disclosure.

The appended drawings are not necessarily to scale and may present a somewhat simplified representation of various preferred features of the present disclosure as disclosed herein, including, for example, specific dimensions, orientations, locations, and shapes. Details adjacent to such features will be determined in part by the particular intended application and use environment.

DETAILED DESCRIPTION

The components of the disclosed embodiments, as described and illustrated herein, may be arranged and designed in a variety of different configurations. Thus, the following detailed description is not intended to limit the scope of the disclosure, as claimed, but is merely representative of possible embodiments thereof. In addition, while numerous specific details are set forth in the following description in order to provide a thorough understanding of the embodiments disclosed herein, some embodiments may be practiced without some of these details. Moreover, for the purpose of clarity, certain technical material that is understood in the related art has not been described in detail in order to avoid unnecessarily obscuring the disclosure. Furthermore, the disclosure, as illustrated and described herein, may be practiced in the absence of an element that is not specifically disclosed herein.

The present disclosure is susceptible of embodiment in many different forms. Representative examples of the disclosure are shown in the drawings and described herein in detail as non-limiting examples of the disclosed principles. To that end, elements and limitations described herein, but not explicitly set forth in the claims, are not to be incorporated into the claims, singly or collectively, by implication, inference, or otherwise.

For purposes of the present description, unless specifically disclaimed, use of the singular includes the plural and vice versa, the terms "and" and "or" shall be both conjunctive and disjunctive, and the words "including," "containing," "comprising," "having," and the like shall mean "including without limitation." Moreover, words of approximation such as "about," "almost," "substantially," "generally," "approximately," etc., may be used herein in the sense of "at, near, or nearly at," or "within 0-5% of," or "within acceptable manufacturing tolerances," or logical combinations thereof.

As used herein, the term "system" refers to mechanical and electrical hardware, software, firmware, electronic control componentry, processing logic, and/or processor device, individually or in combination, including without limitation: application specific integrated circuit (ASIC), an electronic circuit, a processor (shared, dedicated, or group) that executes one or more software or firmware programs, memory device(s) that electrically store software or firmware instructions, a combinatorial logic circuit, and/or other components that provide the described functionality.

As employed herein, terms such as "vertical", "horizontal", "left", "right", "upper", "lower", "top", "bottom" and similar expressions are non-limiting terms that merely describe the various elements as illustrated in the Figures and are not intended to limit the scope of the disclosure.

As used herein, the term "electric machine" refers to an electric motor, generator, or motor-generator device including a rotor and a stator that is capable of converting electric power to mechanical power and/or converting mechanical power to electric power by electromagnetic effort.

Figure 2:
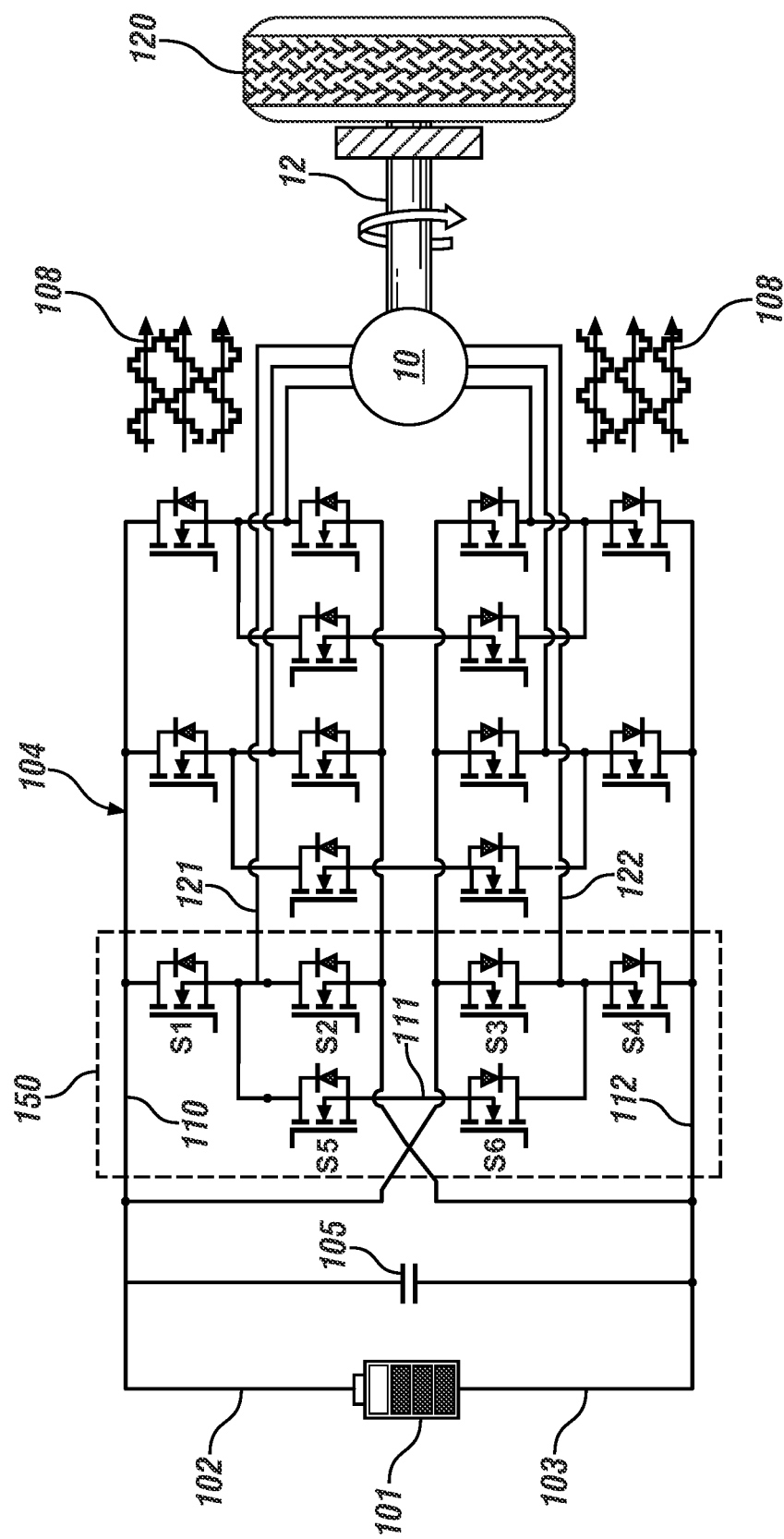
FIG. 2 schematically illustrates an electric drivetrain system including a multi-phase power inverter includes a plurality of H-type multilevel power converters that are arranged between a high-voltage DC power supply and an electric machine, in accordance with the disclosure.

Referring to the drawings, wherein like reference numbers refer to the same or like components in the several Figures, FIGS. 1 and 2 schematically illustrate an electric drivetrain 100 that is composed of a high-voltage DC power source 101, a multi-phase power inverter 104, a multi-phase rotary electric motor, generator, or motor-generator (electric machine) 10, and a torque actuator 120, the operations of which are monitored and controlled by a controller 130.

According to one aspect of the disclosure, the electric drivetrain 100 is arranged to generate and transfer torque to actuator 120 in the form of one or multiple drive wheels 120 to effect work. Controller 130 executes control routines 36 to control and manage operation of the multi-phase power inverter 104.

The electric drivetrain 100 is disposed on an electrified vehicle, schematically illustrated at 20, and capable of generating tractive torque for vehicle propulsion. When disposed on the electrified vehicle 20, the electrified vehicle 20 may include, but not be limited to a mobile platform in the form of a commercial vehicle, industrial vehicle, agricultural vehicle, passenger vehicle, aircraft, watercraft, train, all-terrain vehicle, personal movement apparatus, robot and the like to accomplish the purposes of this disclosure. Alternatively, the electric drivetrain 100 may be an element of a stationary system.

The controller 130 may be embodied as one or more digital computing devices and may include one or more processors 134 and memory 132. A control routine 36 may be stored as an executable instruction set in the memory 132 and executed by one of the processors 134 of the controller 130. The controller 130 is in communication with the multi-phase power inverter 104 to control operation thereof in response to execution of the control routine 36 to operate the electric machine 10.

The term "controller" and related terms such as microcontroller, control module, module, control, control unit, processor and similar terms refer to one or various combinations of Application Specific Integrated Circuit(s) (ASIC), Field-Programmable Gate Array (FPGA), electronic circuit(s), central processing unit(s), e.g., microprocessor(s) and associated memory component(s) in the form of transitory and/or non-transitory memory component(s) and storage devices (read only, programmable read only, random access, hard drive, etc.). The non-transitory memory component is capable of storing machine readable instructions in the form of one or more software or firmware programs or routines, combinational logic circuit(s), input/output circuit(s) and devices, signal conditioning and buffer circuitry and other components that may be accessed by one or more processors to provide a described functionality. Input/output circuit(s) and devices include analog/digital inverters and related devices that monitor inputs from sensors, with such inputs monitored at a preset sampling frequency or in response to a triggering event. Software, firmware, programs, instructions, control routines, code, algorithms and similar terms mean controller-executable instruction sets including calibrations and look-up tables.

The electric machine 10 includes a cylindrically-shaped rotor assembly arranged on a rotor shaft and disposed within an annularly-shaped stator, wherein the rotor assembly is coaxial with a rotor opening that is formed in the stator. Other elements of the electric machine 10, e.g., end caps, shaft bearings, electrical connections, etc., are included but not shown. Electrical windings of the stator are arranged with a quantity of electrical phases and a quantity of electrical turns per phase. Depending on the specific arrangement, the quantity of electrical phases may be between 3 and 6, and the quantity of layers of conductors may be between 4 and 12.

The multi-phase power inverter 104 includes a plurality of semiconductor switch switches (illustrated with reference to FIG. 2, et seq.) that are arranged and controllable to transform DC electric power to AC electric power, and transform AC electric power to DC electric power, employing a pulse-width modulation signal 108 or another control technique. The multi-phase power inverter 104 is arranged and is controllable to transform DC electric power originating from the high-voltage DC power source 101 to AC electric power to actuate the electric machine 10 via electromagnetic effort. The electric machine 10 is controllable to rotate and generate mechanical torque that is transferred via a rotatable member 12 and a geartrain 114 to the actuator 120 when operating in a torque generating mode. The electric machine 10 is controllable to generate AC electric power from mechanical torque originating at the actuator 120 via electromagnetic effort, which is transformed by the multi-phase power inverter 104 to DC electric power for storage in the high-voltage DC power source 101 when operating in an electric power generating mode.

According to one aspect of the disclosure, the actuator 120 includes, a vehicle wheel that transfers torque to a ground surface to effect forward motion as part of a traction propulsion system. The high-voltage DC power source 101 may be in the form of a rechargeable electrochemical battery device, a fuel cell, an ultracapacitor, and/or another electrical energy storage/generation technology.

The high-voltage DC power source 101 may be a rechargeable electrochemical battery device, a fuel cell, an ultracapacitor, and/or another electrical energy storage/generation technology. The high-voltage DC power source 101 connects to the multi-phase power inverter 104 via a high-voltage DC bus having a positive link 102 and a negative link 103, and the multi-phase power inverter 104 connects to the electric machine 10 via a plurality of first AC buses 121 and second AC buses 122 to transfer the pulse-width modulation signal 108.

As illustrated with reference to FIG. 2, the multi-phase power inverter 104 of the electric drivetrain 100 is composed with a plurality of H-type multilevel power converters 150 that are arranged between the high-voltage DC power source 101 and the electric machine 10, with a single DC-link capacitor 105 between the high-voltage DC power source 101 and the multi-phase power inverter 104 of the electric drivetrain 100. As illustrated, and in one non-limiting aspect of the disclosure, the multi-phase power inverter 104 of the electric drivetrain 100 is composed with a quantity of three of the H-type multilevel power converters 150.

Figure 3:
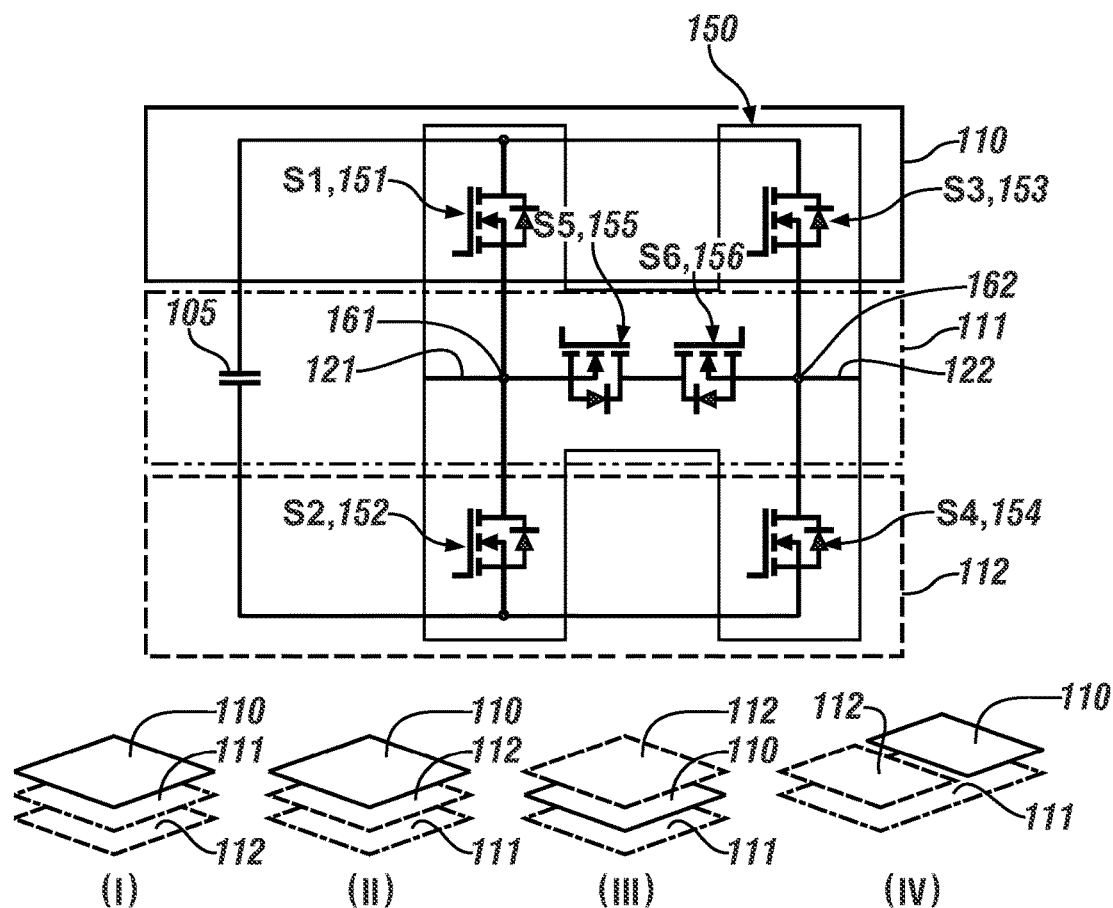
FIG. 3 schematically illustrates an H-type multilevel power converter, in accordance with one aspect of the disclosure.

Referring now to FIG. 3, the topology of each of the H-type multilevel power converters 150 is arranged as a multilevel inverter (MLI).

According to one aspect of the disclosure, and as described herein, each of the H-type multilevel power converters 150 employs a neutral-point-less (NPL) MLI topology. Topology refers to the physical arrangement of the constituent elements, including network busbar interconnects, dielectrics, semiconductor switches, and other elements.

Each of the H-type multilevel power converters 150 is arranged as a solid-state integrated circuit (IC) having a plurality of semiconductor switches that are disposed in a stacked or tiered arrangement. The plurality of semiconductor switches includes, in one aspect of the disclosure and as shown, a first semiconductor switch S1 151, a second semiconductor switch S2 152, a third semiconductor switch S3 153, a fourth semiconductor switch S4 154, a fifth semiconductor switch S5 155, and a sixth semiconductor switch S6 156.

According to one aspect of the disclosure, at least a portion of the semiconductor switches are field-effect transistors (FETs). According to another aspect of the disclosure, the FETs are gallium nitride (GaN) transistors. According to another aspect of the disclosure, at least a portion of the semiconductor switches are insulated-gate bipolar transistors (IGBTs).

Other constituent elements of the H-type multilevel power converter 150 includes the positive DC power bus 110, neutral bus 111, the negative DC power bus, the first AC bus 121, and the second AC bus 122. The first semiconductor switch S1 151 is arranged in series with the second semiconductor switch S2 152 between the positive DC power bus 110 and the negative DC power bus 112, with the first semiconductor switch S1 151 being connected to the second semiconductor switch S2 at a first node 161. The fifth semiconductor switch S5 155 is also connected to the first node 161. The first node 161 connects to the first AC bus 121 to transfer power to the electric machine 10 (shown with reference to FIG. 2).

The third semiconductor switch S3 153 is arranged in series with the fourth semiconductor switch S4 154 between the positive DC power bus 110 and the negative DC power bus 112, with the third semiconductor switch S3 153 being connected to the fourth semiconductor switch S4 154 at a second node 162. The sixth semiconductor switch 156 is also connected to the second node 162. The second node 162 connects to the second AC bus 122 to transfer power to the electric machine 10 (shown with reference to FIG. 2). The fifth semiconductor switch S5 155 is arranged in series with the sixth semiconductor switch S6 156 between the first node 161 and the second node 162 via the neutral bus 111.

A positive DC power bus 110, a neutral power bus 111, and a negative DC power bus 112, are schematically illustrated.

By configuring the topology within each of the H-type multilevel converters 150 such that both the positive DC power bus 110 and the negative DC power bus 112 are parallel with the neutral bus 111, mutual inductance cancellation minimizes parasitic inductance by coupling positive mutual inductance and negative mutual inductance for commutation loop currents within each of the H-type multilevel converters 150.

According to one aspect of the disclosure, illustrated at (I), the buses are configured, from top 33 to bottom 34, such that the positive DC power bus 110 is parallel to the neutral bus 111, which is then parallel to the negative DC power bus 112.

According to another aspect of the disclosure, as illustrated at (II), the buses are configured, from top 33 to bottom 34, such that the positive DC power bus 110 is parallel to the negative DC power bus 112, which is then parallel to the neutral bus 111.

According to another aspect of the disclosure, as illustrated at (III), the buses are configured, from top 33 to bottom 34, such that the neutral bus 111, is parallel with the positive DC power bus 110, which is then parallel to the negative DC power bus 112.

According to another aspect of the disclosure, as illustrated at (IV), the positive DC power bus 110 is coplanar with the negative DC power bus 112, while both the positive DC power bus 110 and the negative DC power bus 112 are parallel with the neutral bus 111.

While several topologies are discussed above, they are merely exemplary and non-limiting aspects of the disclosure. Accordingly, it should be appreciated that, within each of the H-type multilevel converters 150, mutual inductance cancellation minimizes parasitic inductance by coupling positive mutual inductance and negative mutual inductance for commutation loop currents within each of the H-type multilevel converters 150, i.e., by configuring the topology of the H-type multilevel inverter 150 such that both the positive DC power bus 110 and the negative DC power bus 112 are parallel with the neutral bus 111.

Figure 4:
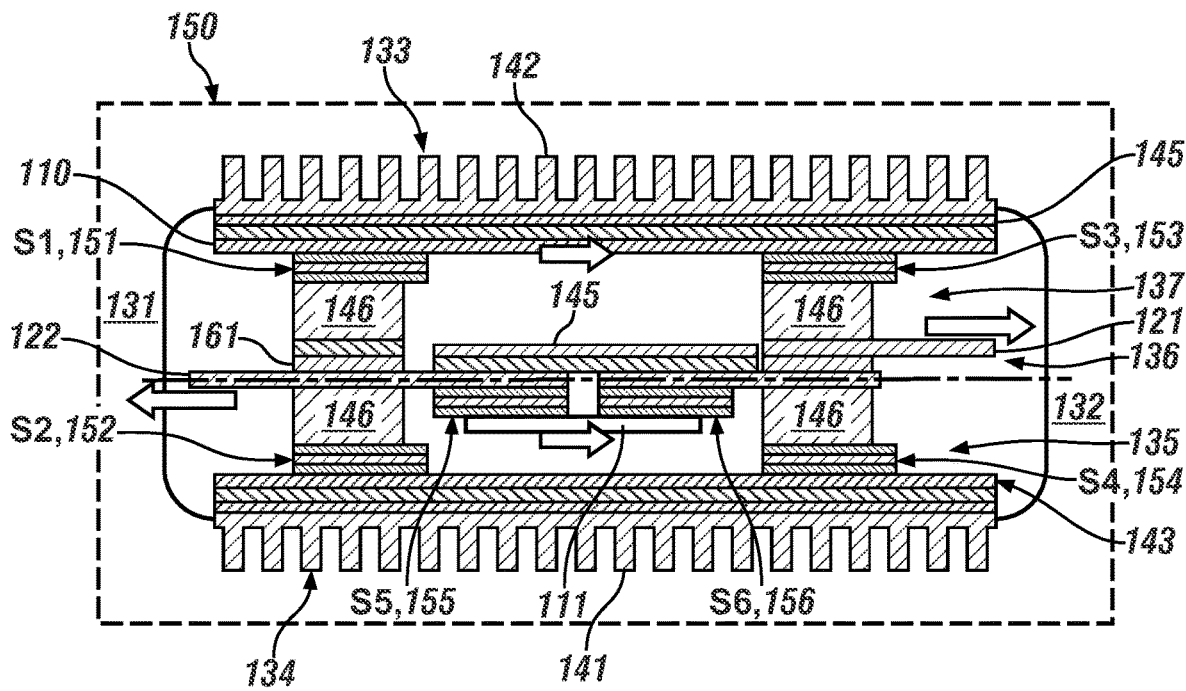
FIG. 4 schematically illustrates a cutaway sideview of an H-type multilevel power converter, in accordance with one aspect of the disclosure.

Referring now to FIG. 4, according to one aspect of the disclosure, the H-type multilevel power converter 150 is illustrated, and includes a first semiconductor switch S1 151, a second semiconductor switch S2 152, a third semiconductor switch S3 153, a fourth semiconductor switch S4 154, a fifth semiconductor switch S5 155, a sixth semiconductor switch S6 156, a positive DC power bus 110, a negative DC power bus 112, a neutral bus 111, a first AC bus 121, a second AC bus 122, a first direct bonded copper (DBC) plate 143, a second DBC plate 144, a third DBC plate 145, a plurality of conductive spacers 146, a first heat sink 141, and a second heat sink 142.

The first semiconductor switch S1 151, second semiconductor switch S2 152, third semiconductor switch S3 153, fourth semiconductor switch S4 154, fifth semiconductor switch S5 155, and sixth semiconductor switch S6 156 are arranged in a stacked or multi-tiered configuration, including a first (lower) tier 135, a second (middle) tier 136, and a third (upper) tier 137. The first tier 135 includes the second semiconductor switch S2 152 and the fourth semiconductor switch S4 154, which are coplanar. The second tier 136 includes the fifth semiconductor switch S5 155 and sixth semiconductor switch S6 156, which are coplanar. The third tier 137 includes the first semiconductor switch S1 151 and the third semiconductor switch S3 153, which are coplanar.

The complete stacked arrangement includes, in ascending order from bottom 134 to top 133: the first heat sink 141; the first DBC plate 143; the negative DC power bus 112; the first tier 135 including the second semiconductor switch S2 152 and the fourth semiconductor switch S4 154; the neutral bus 111; the second tier 136 including the fifth semiconductor switch S5 155 and sixth semiconductor switch S6 156, the second AC bus 122, the first AC bus 121, the second DBC plate 144, and various conductive spacers 146; the third tier 137 including the first semiconductor switch S1 151, the third semiconductor switch S3 153, and positive DC power bus 110; the third DBC plate 145; and the second heat sink 142.

The first semiconductor switch S1 151, the second semiconductor switch S2 152, and the fifth semiconductor switch S5 155 are joined at the first node 161, which is connected to the second AC bus 122. The third semiconductor switch S3 153, fourth semiconductor switch S4 154, and sixth semiconductor switch S6 156 are joined at the second node 162, which is connected to the first AC bus 121. The first heat sink 141 is adjoined via the first DBC plate 143, and the second heat sink is adjoined via the third DBC plate 145.

Figure 5:
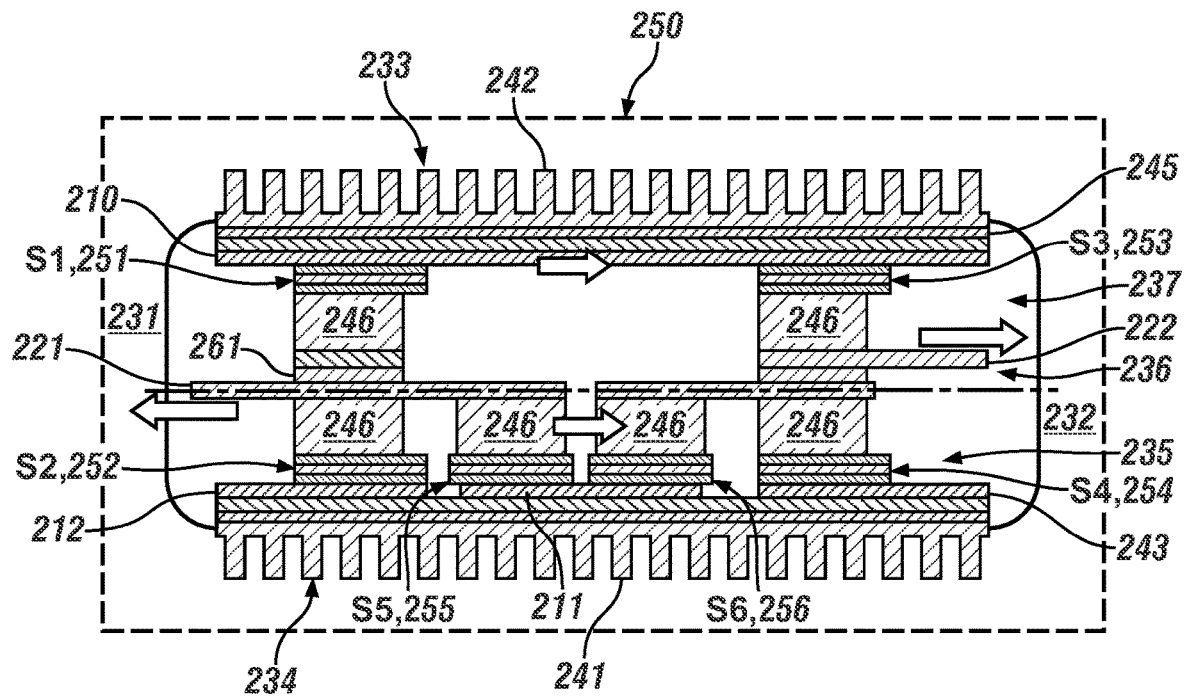
FIG. 5 schematically illustrates a cutaway sideview of an H-type multilevel power converter, in accordance with another aspect of the disclosure.

Referring now to FIG. 5, according to another aspect of the disclosure, the H-type multilevel power converter 250 is illustrated, and includes a first semiconductor switch S1 251, a second semiconductor switch S2 252, a third semiconductor switch S3 253, a fourth semiconductor switch S4 254, a fifth semiconductor switch S5 255, a sixth semiconductor switch S6 256, a positive DC power bus 210, a negative DC power bus 212, a neutral bus 211, a first AC bus 221, a second AC bus 222, a first direct bonded copper (DBC) plate 243, a second DBC plate 244, a plurality of conductive spacers 246, a first heat sink 241, and a second heat sink 242.

The first semiconductor switch S1 251, the second semiconductor switch S2 252, the third semiconductor switch S3 253, the fourth semiconductor switch S4 254, the fifth semiconductor switch S5 255, and the sixth semiconductor switch S6 256 are arranged in a stacked or multi-tiered configuration, including a first (lower) tier 235, a second (middle) tier 236, and a third (upper) tier 237. The first tier 235 includes the second semiconductor switch S2 252, the fifth semiconductor switch S5 255, sixth semiconductor switch S6 256, and the fourth semiconductor switch S4 254, which are coplanar. The second semiconductor switch S2 252 and the fourth semiconductor switch S4 254 are arranged on the negative DC power bus 212, which is arranged on the first DBC plate 243. The fifth semiconductor switch S5, 255 and the sixth semiconductor switch S6 256 are arranged on the neutral bus 211, which is arranged on the first DBC plate 243. The second tier 236 includes the second AC bus 222 and the first AC bus 221, and various conductive spacers 246. The third tier 237 includes the first semiconductor switch S1 251 and the third semiconductor switch S3 253, which are coplanar, and are arranged on the positive DC power bus 210.

The complete stacked arrangement includes, in ascending order from bottom 234 to top 233: the first heat sink 241; the first DBC plate 243; the negative DC power bus 212 and the neutral bus 211; the first tier 235 including the second semiconductor switch S2 252, the fifth semiconductor switch S5 255, the sixth semiconductor switch S6 256, and the fourth semiconductor switch S4 254; the second tier 236 including the second AC bus 222, the first AC bus 221, and various conductive spacers 246; the third tier 237 including the first semiconductor switch S1 251 and the third semiconductor switch S3 253; the positive DC power bus 210; the second DBC plate 244; and the second heat sink 242.

The first semiconductor switch S1 251, the second semiconductor switch S2 252, and the fifth semiconductor switch S5 255 are joined at a first node 261, which is connected to the first AC bus 221. The third semiconductor switch S3 253, fourth semiconductor switch S4 254, and sixth semiconductor switch S6 256 are joined at a second node 262, which is connected to the second AC bus 222. The first heat sink 241 is adjoined via the first DBC plate 243, and the second heat sink is adjoined via the second DBC plate 244.

Figure 6:
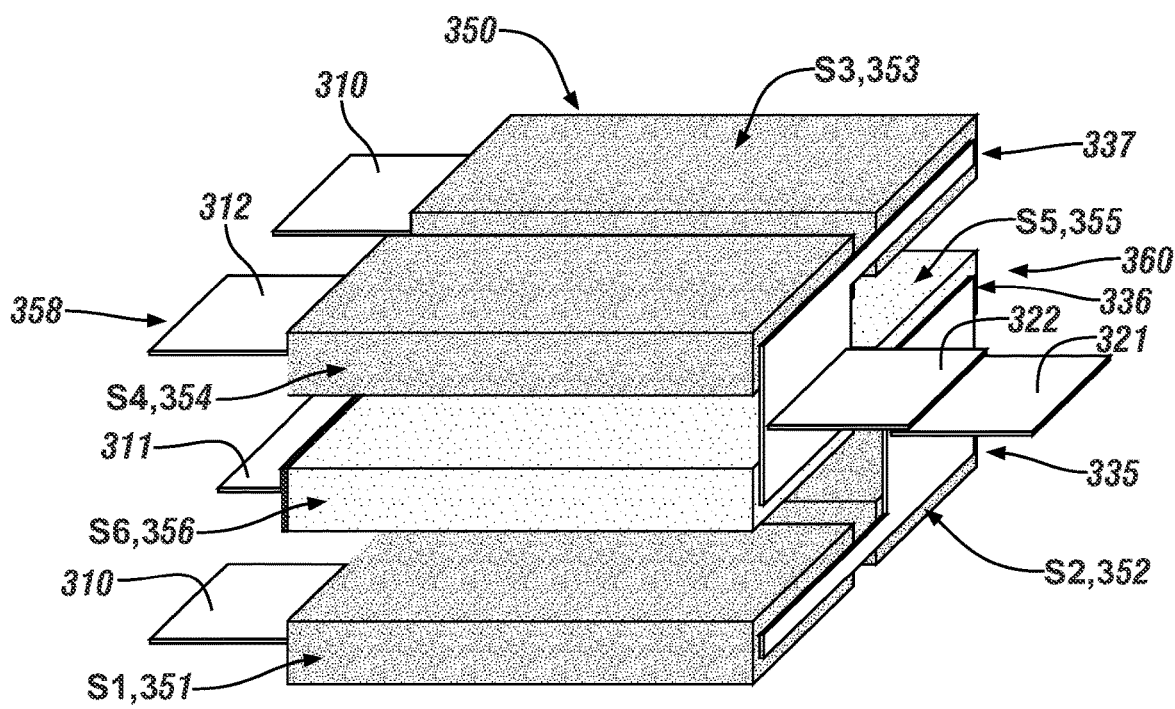
FIG. 6. schematically illustrates an isometric view of an arrangement of elements of an H-type multilevel power converter, in accordance with one aspect of the disclosure.

Referring now to FIG. 6, according to another aspect of the disclosure, the H-type multilevel converter 350 is illustrated, and includes a first semiconductor switch S1 351, a second semiconductor switch S2 352, a third semiconductor switch S3 353, a fourth semiconductor switch S4 354, a fifth semiconductor switch S5 355, a sixth semiconductor switch S6 356, a positive DC power bus 310, a negative DC power bus 312, a neutral bus 311, a first AC bus 321, and a second AC bus 322. It is understood that other elements that have been previously described have been omitted but are included in an aspect of the H-type multilevel power converter 350 when reduced to practice.

The first semiconductor switch S1 351, second semiconductor switch S2 352, third semiconductor switch S3 353, fourth semiconductor switch S4 354, fifth semiconductor switch S5 355, and sixth semiconductor switch S6 356 are arranged in a stacked or multi-tiered configuration, including a first (lower) tier 335, a second (middle) tier 336, and a third (upper) tier 337. The first tier 335 includes the first semiconductor switch S1 251 and the second semiconductor switch S2 352, which are coplanar. The second tier 336 includes the fifth semiconductor switch S5 355 and the sixth semiconductor switch S6 356, which are coplanar. The third tier 337 includes the fourth semiconductor switch S4 354 and the third semiconductor switch S3 353, which are coplanar.

The positive DC power bus 310 and the negative DC power bus 312 are located on a first end 358 of the H-type multilevel converter 350, while the first AC bus 321 and the second AC bus 322 are located on a second end 360 of the H-type multilevel converter. The first AC bus 321, the second AC bus 322, the positive DC power bus 310, the negative DC power bus 312, and the neutral bus 311 are connected as illustrated, consistent with the circuit that is illustrated with reference to FIG. 3.

According to this aspect of the disclosure, both the first AC bus 321 and the second AC bus 322 are on the same end, i.e., the second end 360, of the H-type multilevel converter 350. This configuration facilitates improved electromagnetic coupling, thereby reducing parasitic inductance.

Figure 7:
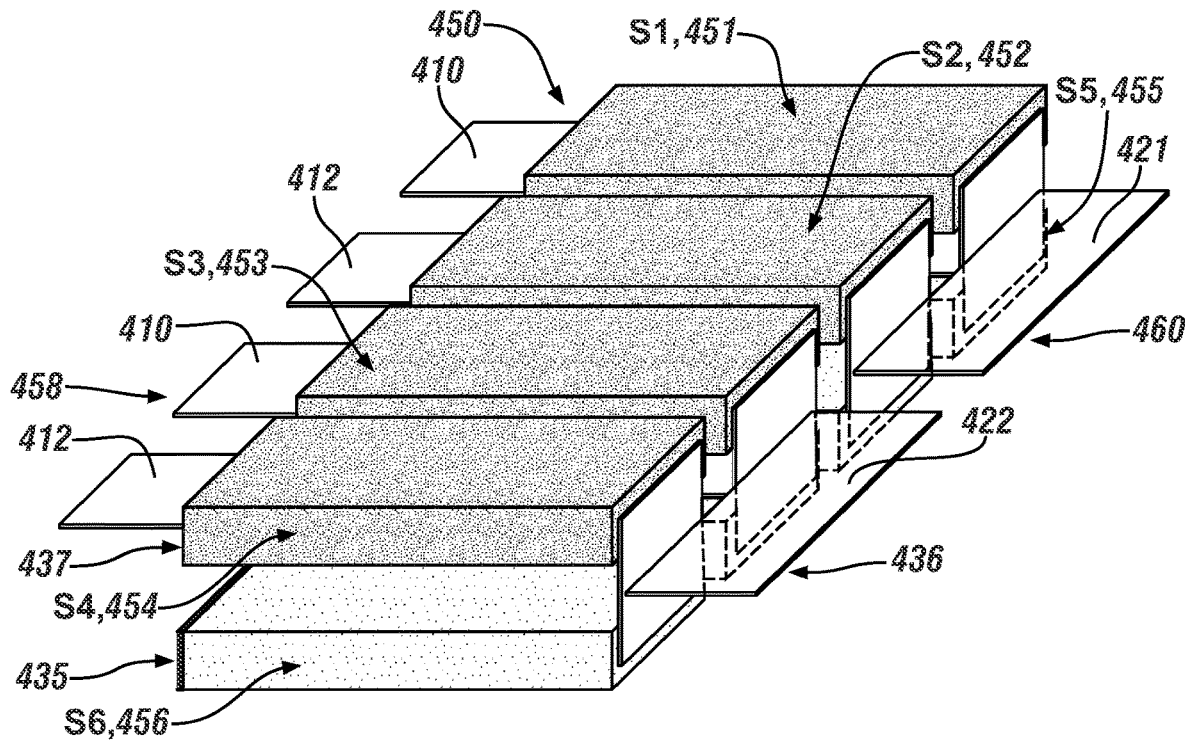
FIG. 7 schematically illustrates an isometric view of one arrangement of elements of an H-type multilevel power converter, in accordance with another aspect of the disclosure.

Referring now to FIG. 7, according to another aspect of the disclosure, the H-type multilevel converter 450 is illustrated, and includes a first semiconductor switch S1 451, a second semiconductor switch S2 452, a third semiconductor switch S3 453, a fourth semiconductor switch S4 454, a fifth semiconductor switch S5 455, a sixth semiconductor switch S6 456, a positive DC power bus 410, a negative DC power bus 412, a neutral bus 411, a first AC bus 421, and a second AC bus 422. It is understood that other elements that have been previously described have been omitted but are included in an aspect of the H-type multilevel power converter 450 when reduced to practice.

The first semiconductor switch S1 451, second semiconductor switch S2 452, third semiconductor switch S3 453, fourth semiconductor switch S4 454, fifth semiconductor switch S5 455, and sixth semiconductor switch S6 456 are arranged in a stacked or multi-tiered configuration, including a first (lower) tier 435, a second (middle) tier 436, and a third (upper) tier 437. The first tier 435 includes the sixth semiconductor switch S6 456 and the fifth semiconductor switch S5 455, which are coplanar. The second tier 436 includes the first AC bus 421, and the second AC bus 422. The third tier 437 includes the fourth semiconductor switch S4 454, the third semiconductor switch S3, 453, the second semiconductor switch S2 452, and the first semiconductor switch S1 451, which are coplanar.

The positive DC power bus 410 and the negative DC power bus 412 are located on a first end 458 of the H-type multilevel converter 350, while the first AC bus 421 and the second AC bus 422 are located on a second end 460 of the H-type multilevel converter. The first AC bus 421, the second AC bus 422, the positive DC power bus 410, the negative DC power bus 412, and the neutral bus 411 are connected as illustrated, consistent with the circuit that is illustrated with reference to FIG. 3.

Figure 8:
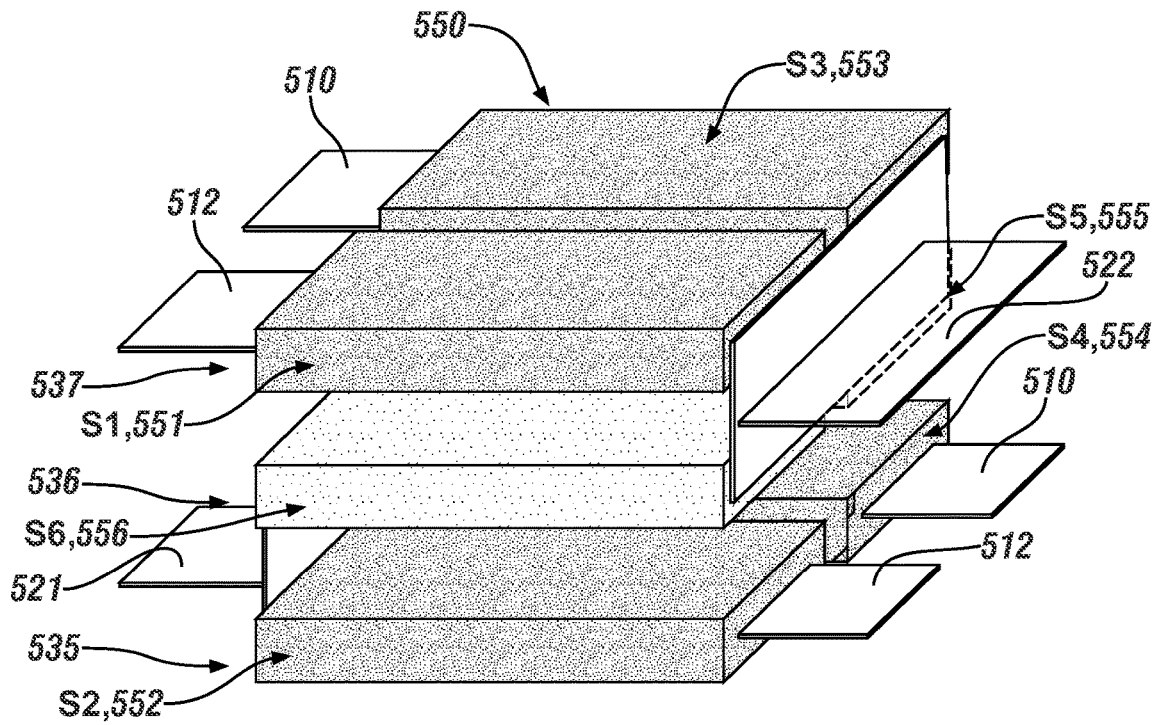
FIG. 8 schematically illustrates an isometric view of another arrangement of elements of an H-type multilevel power converter, in accordance with another aspect of the disclosure.

Referring now to FIG. 8, according to another aspect of the disclosure, the H-type multilevel power converter 550 is illustrated, and includes a first semiconductor switch S1 551, a second semiconductor switch S2 552, a third semiconductor switch S3 553, a fourth semiconductor switch S4 554, a fifth semiconductor switch S5 555, a sixth semiconductor switch S6 556, a positive DC power bus 510, a negative DC power bus 512, a first AC bus 521, and a second AC bus 522. It is understood that other elements that have previously described have been omitted but are included in an aspect of the disclosure of the H-type multilevel power converter 550 when reduced to practice.

The first semiconductor switch S1 551, second semiconductor switch S2 552, third semiconductor switch S3 553, fourth semiconductor switch S4 554, fifth semiconductor switch S5 555, and sixth semiconductor switch S6 556 are arranged in a stacked or multi-tiered configuration, including a first (lower) tier 535, a second (middle) tier 536, and a third (upper) tier 537. The first tier 535 includes the second semiconductor switch S2 552, and the fourth semiconductor switch S4 554, which are coplanar. The second tier 536 includes the fifth semiconductor switch S5 555 and sixth semiconductor switch S6 556. The third tier 537 includes the first semiconductor switch S1 551 and the third semiconductor switch S3 553, which are coplanar. The first AC bus 521, the second AC bus 522, the positive DC power bus 510, and the negative DC power bus 512 are connected as illustrated, consistent with the arrangement of the circuit that is illustrated with reference to FIG. 3.

According to this aspect of the disclosure, the first AC bus 521 is located on a first end 558 of the H-type multilevel converter 550, while the second AC bus 522 is located on a second end 560 of the H-type multilevel converter 550. Each of the first AC bus 520 and the second AC bus 522 extend a width W of two semiconductor switches S2 552, S4 554, and S1 551, S3 553, respectively, of the H-type multilevel converter 550. This configuration provides wider paralleling of the first AC bus 521 and the second AC bus 522, facilitating current flow, reducing both resistance and parasitic inductance.

Figure 9:
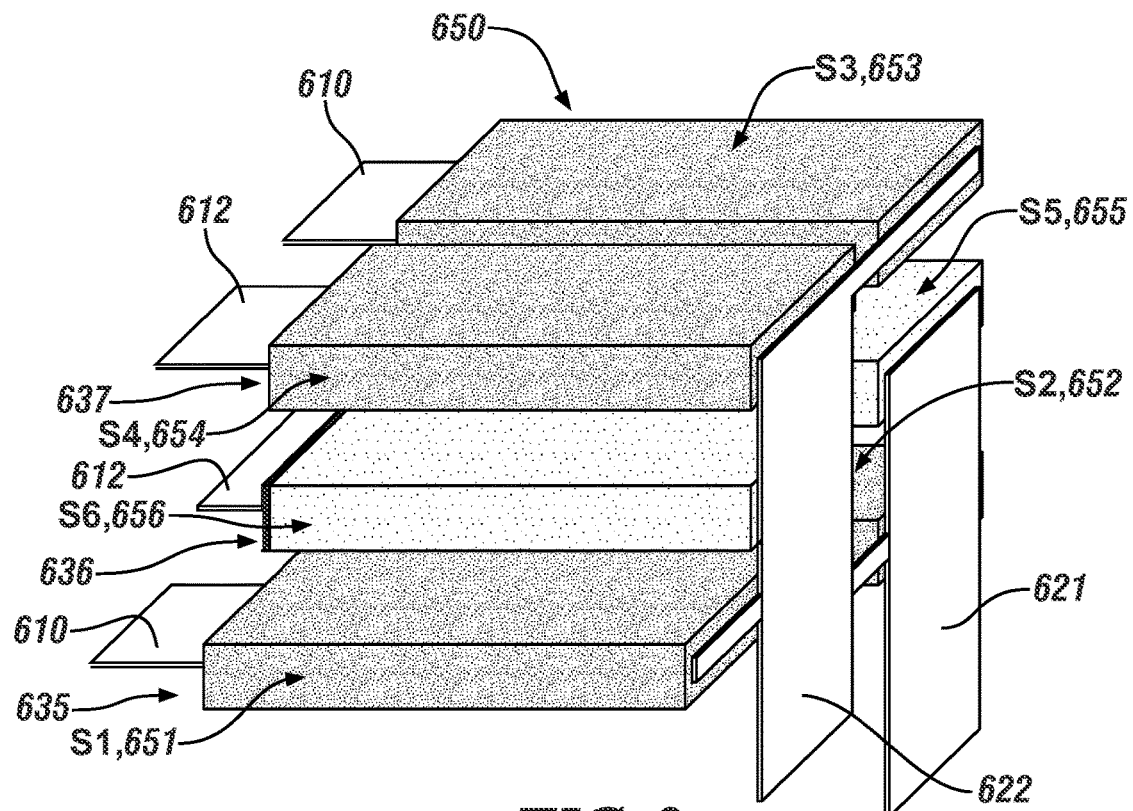
FIG. 9 schematically illustrates an isometric view of another arrangement of elements of an H-type multilevel power converter, in accordance with another aspect of the disclosure.

Referring now to FIG. 9, according to another aspect of the disclosure, the H-type multilevel power converter 650 is illustrated, and includes a first semiconductor switch S1 651, a second semiconductor switch S2 652, a third semiconductor switch S3 653, a fourth semiconductor switch S4 654, a fifth semiconductor switch S5 655, a sixth semiconductor switch S6 656, a positive DC power bus 610, a negative DC power bus 612, a first AC bus 621, and a second AC bus 622. It is understood that other elements that have previously been described have been omitted but are included in an embodiment of the H-type multilevel power converter 650 when reduced to practice.

The first semiconductor switch S1 651, the second semiconductor switch S2 652, the third semiconductor switch S3 653, the fourth semiconductor switch S4 654, the fifth semiconductor switch S5 655, and the sixth semiconductor switch S6 656 are arranged in a stacked or multi-tiered configuration, including a first (lower) tier 635, a second (middle) tier 636, and a third (upper) tier 637. The first tier 635 includes the first semiconductor switch S1 651 and the second semiconductor switch S2 652, which are coplanar. The second tier 636 includes the fifth semiconductor switch S5 655 and sixth semiconductor switch S6 656. The third tier 637 includes the third semiconductor switch S3 653 and the fourth semiconductor switch S4 654, which are coplanar. The first AC bus 621, the second AC bus 622, the positive DC power bus 610, and the negative DC power bus 612 are connected as illustrated, consistent with the arrangement of the circuit that is illustrated with reference to FIG. 3.

According to this aspect of the disclosure, both the first AC bus 621 and the second AC bus 622 extend vertically downward from the H-type multilevel converter 650. This configuration allows direct-mount of the H-type multilevel converter to the electric machine 10, thereby reducing a length of the AC buses 621, 622 between the H-type multilevel converter 650 and the electric machine 10, minimizing voltage overshoot.

Figure 10:
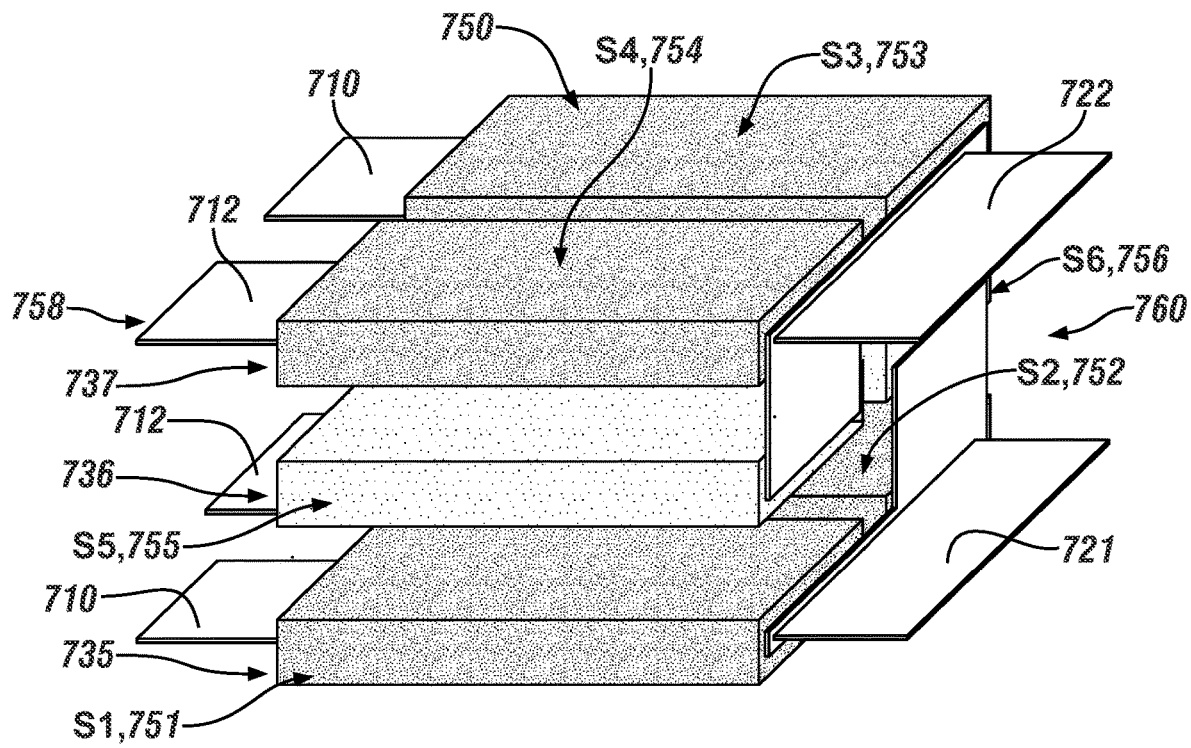
FIG. 10 schematically illustrates an isometric view of another arrangement of elements of an H-type multilevel power converter, in accordance with another aspect of the disclosure.

Referring now to FIG. 10, according to another aspect of the disclosure, the H-type multilevel power converter 750 is illustrated, and includes a first semiconductor switch S1 751, a second semiconductor switch S2 752, a third semiconductor switch S3 753, a fourth semiconductor switch S4 754, a fifth semiconductor switch S5 755, a sixth semiconductor switch S6 756, a positive DC power bus 710, a negative DC power bus 712, a first AC bus 721, and a second AC bus 722. It is understood that other elements that have previously been described have been omitted but are included in an aspect of the disclosure of the H-type multilevel power converter 750 when reduced to practice.

The first semiconductor switch S1 751, second semiconductor switch S2 752, third semiconductor switch S3 753, fourth semiconductor switch S4 754, fifth semiconductor switch S5 755, and sixth semiconductor switch S6 756 are arranged in a stacked or multi-tiered configuration, including a first (lower) tier 735, a second (middle) tier 736, and a third (upper) tier 737. The first tier 735 includes the first semiconductor switch S1 751 and the second semiconductor switch S2 752, which are coplanar. The second tier 736 includes the fifth semiconductor switch S5 755 and sixth semiconductor switch S6 756. The third tier 737 includes the third semiconductor switch S3 753 and the fourth semiconductor switch S4 754, which are coplanar. The first AC bus 721, the second AC bus 722, the positive DC power bus 710, the negative DC power bus 712, and the neutral bus 711 are connected as illustrated, consistent with the arrangement of the circuit that is illustrated with reference to FIG. 3.

According to this aspect of the disclosure, both the negative DC power bus 712, and the positive DC power bus 710 are located on a first end 758 of the H-type multilevel converter 750, while the first AC bus 721 and the second AC bus 722 are located on a second end 760 of the H-type multilevel converter 750. Each of the first AC bus 720 and the second AC bus 722 extend a width W of two semiconductor switches S1 751, S2 752 and S3 753, S4 754, respectively, of the H-type multilevel converter 750. This configuration facilitates current flow, reducing both resistance and parasitic inductance.

The illustrated aspects of the disclosure of the H-type multilevel power converter provide for overlapping of the positive DC power bus, the neutral bus, and the negative DC power bus to reduce mutual inductance. This arrangement includes overlaying the first AC bus on the second AC bus to cancel dV/dt and reduce or eliminate electromagnetic interference and achieve field cancellation via the P, 0, and N currents to minimize parasitic loop and stray inductances.

This arrangement facilitates optimal design of the positive DC power bus, negative DC power bus, neutral bus, and the DC-link capacitor to achieve mutual inductance cancellation.

This arrangement facilitates various heat transfer and cooling systems, including direct cooling, indirect cooling, immersive cooling, single-sided or double-sided cooling.

This arrangement facilitates a reduction in voltage/current overshoot for device stress, including die/power module, bus bars, DC-link capacitor.

This arrangement facilitates size reduction and increased power density compared to current systems.

This arrangement facilitates use of lower voltage rating semiconductor switch dies for lower conduction loss and increased EV range compared to current systems.

This arrangement facilitates reduced ringing and radiative/conductive electromagnetic interference to other subsystems, and enables higher switching speed which reduces loss and hence increases vehicle range and current capability.

These and other attendant benefits of the present disclosure will be appreciated by those skilled in the art in view of the foregoing disclosure.

The detailed description and the drawings or figures are supportive and descriptive of the present teachings, but the scope of the present teachings is defined solely by the claims. While some of the best modes and other examples for carrying out the present teachings have been described in detail, various alternative designs and aspects of the disclosure exist for practicing the present teachings defined in the appended claims.

What is claimed is:

1. A multi-phase power inverter for an electric propulsion system, the multi-phase power inverter comprising:
  a plurality of H-type multilevel power converters arranged between a high-voltage DC power supply and an electric machine of the electric propulsion system, wherein each of the plurality of H-type multilevel power converters is arranged as a solid-state integrated circuit (IC) including:
    a positive DC power bus;
    a negative DC power bus;
    a neutral bus;
    a plurality of semiconductor switches disposed in a stacked arrangement;
    wherein the plurality of semiconductor switches includes a first semiconductor switch, a second semiconductor switch, a third semiconductor switch, a fourth semiconductor switch, a fifth semiconductor switch, and a sixth semiconductor switch;
    wherein the stacked arrangement includes a stack having:
      a first tier composed of the second semiconductor switch arranged to be coplanar with the fourth semiconductor switch;
      a second tier composed of the fifth semiconductor switch arranged to be coplanar with the sixth semiconductor switch; and
      a third tier composed of the first semiconductor switch arranged to be coplanar with the third semiconductor switch, wherein the first tier is arranged in parallel with the second tier;
    wherein the plurality of semiconductor switches are interconnected via the positive DC power bus, the negative DC power bus, and the neutral bus;
    wherein the first semiconductor switch is connected at a first node, the second semiconductor switch is connected to the first semiconductor switch at the first node, wherein the first semiconductor switch is arranged in series with the second semiconductor switch between the positive DC power bus and the negative DC power bus;
    wherein the third semiconductor switch is connected at a second node, the fourth semiconductor switch is connected to the third semiconductor switch at the second node, and wherein the third semiconductor switch is arranged in series with the fourth semiconductor switch between the positive DC power bus and the negative DC power bus;
    wherein the fifth semiconductor switch is connected at the first node, the sixth semiconductor switch is connected at the second node, and wherein the fifth semiconductor switch is arranged in series with the sixth semiconductor switch via the neutral bus; and
    a first AC bus connected to the first node;
    a second AC bus connected to the second node;

a first heat sink adjoined to the positive DC power bus of the solid-state IC via a first direct bonded copper (DBC) substrate; and a second heat sink adjoined to the negative DC power bus of the solid-state IC via a second DBC substrate.

2. The multi-phase power inverter as recited in claim 1, wherein the positive DC power bus and the negative DC power bus are arranged on a first end of the H-type multi-level power converter, and wherein the first AC bus and the second AC bus are arranged on a second end of the H-type multilevel power converter.

3. A multi-phase power inverter for an electric propulsion system, the multi-phase power inverter comprising:
- a plurality of H-type multilevel power converters arranged between a high-voltage DC power supply and an electric machine of the electric propulsion system, wherein each of the plurality of H-type multilevel power converters is arranged as a solid-state integrated circuit (IC) including:
- a positive DC power bus;
- a negative DC power bus;
- a neutral bus;
- a plurality of semiconductor switches disposed in a stacked arrangement;
- wherein the plurality of semiconductor switches includes a first semiconductor switch, a second semiconductor switch, a third semiconductor switch, a fourth semiconductor switch, a fifth semiconductor switch, and a sixth semiconductor switch;
- wherein the stacked arrangement includes a stack having:
  - a first tier composed of the second semiconductor switch arranged to be coplanar with the fifth semiconductor switch that is arranged coplanar with the sixth semiconductor switch that is arranged coplanar with the fourth semiconductor switch;
  - a second tier composed of a first AC bus and a second AC bus, wherein the first tier is arranged in parallel with the second tier; and
  - a third tier composed of the first semiconductor switch arranged to be coplanar with the third semiconductor switch, wherein the second tier is arranged in parallel with the third tier; and
- wherein the plurality of semiconductor switches are interconnected via the positive DC power bus, the negative DC power bus, and the neutral bus;
- wherein the first semiconductor switch is connected at a first node, the second semiconductor switch is connected to the first semiconductor switch at the first node, wherein the first semiconductor switch is arranged in series with the second semiconductor switch between the positive DC power bus and the negative DC power bus;
- wherein the third semiconductor switch is connected at a second node, the fourth semiconductor switch is connected to the third semiconductor switch at the second node, and wherein the third semiconductor switch is arranged in series with the fourth semiconductor switch between the positive DC power bus and the negative DC power bus;
- wherein the fifth semiconductor switch is connected at the first node, the sixth semiconductor switch is connected at the second node, and wherein the fifth semiconductor switch is arranged in series with the sixth semiconductor switch via the neutral bus; and
- wherein the first AC bus is connected to the first node, and the second AC bus connected to the second node; and
- wherein a first heat sink is adjoined to the positive DC power bus of the solid-state IC via a first direct bonded copper (DBC) substrate; and
- wherein a second heat sink is adjoined to the negative DC power bus of the solid-state IC via a second DBC substrate.

4. A multi-phase power inverter for an electric propulsion system, the multi-phase power inverter comprising:
- a plurality of H-type multilevel power converters arranged between a high-voltage DC power supply and an electric machine of the electric propulsion system, wherein each of the plurality of H-type multilevel power converters is arranged as a solid-state integrated circuit (IC) including:
- a positive DC power bus;
- a negative DC power bus;
- a neutral bus;
- a plurality of semiconductor switches disposed in a stacked arrangement;
- wherein the plurality of semiconductor switches includes a first semiconductor switch, a second semiconductor switch, a third semiconductor switch, a fourth semiconductor switch, a fifth semiconductor switch, and a sixth semiconductor switch;
- wherein the stacked arrangement includes a stack having:
  - a first tier composed of the first semiconductor switch arranged to be coplanar with the second semiconductor switch;
  - a second tier composed of the fifth semiconductor switch arranged to be coplanar with the sixth semiconductor switch, wherein the first tier is arranged in parallel with the second tier; and
  - a third tier composed of the third semiconductor switch arranged to be coplanar with the fourth semiconductor switch, wherein the second tier is arranged in parallel with the third tier; and
- wherein the plurality of semiconductor switches are interconnected via the positive DC power bus, the negative DC power bus, and the neutral bus;
- wherein the first semiconductor switch is connected at a first node, the second semiconductor switch is connected to the first semiconductor switch at the first node, wherein the first semiconductor switch is arranged in series with the second semiconductor switch between the positive DC power bus and the negative DC power bus;
- wherein the third semiconductor switch is connected at a second node, the fourth semiconductor switch is connected to the third semiconductor switch at the second node, and wherein the third semiconductor switch is arranged in series with the fourth semiconductor switch between the positive DC power bus and the negative DC power bus;
- wherein the fifth semiconductor switch is connected at the first node, the sixth semiconductor switch is connected at the second node, and wherein the fifth semiconductor switch is arranged in series with the sixth semiconductor switch via the neutral bus; and
- a first AC bus connected to the first node;
- a second AC bus connected to the second node;
- a first heat sink adjoined to the positive DC power bus of the solid-state IC via a first direct bonded copper (DBC) substrate; and a second heat sink adjoined to the negative DC power bus of the solid-state IC via a second DBC substrate.

5. The multi-phase power inverter as recited in claim 4, wherein the positive DC power bus and the negative DC power bus are arranged on a first end of the H-type multilevel power converter, and wherein the first AC bus and the second AC bus are arranged on a second end of the H-type multilevel power converter.

6. The multi-phase power inverter as recited in claim 4, wherein the first semiconductor switch, the second semiconductor switch, the third semiconductor switch, and the fourth semiconductor switch each comprise a gallium nitride (GaN) device.

7. The multi-phase power inverter as recited in claim 4, wherein the fifth semiconductor switch and the sixth semiconductor switch each comprise an insulated-gate bipolar transistor (IGBT).

8. The multi-phase power inverter as recited in claim 5, wherein the second AC bus projects outwardly from a bottom portion of the solid-state IC.

\* \* \* \* \*